US010820422B2

(12) United States Patent
Jang et al.

(10) Patent No.: US 10,820,422 B2
(45) Date of Patent: Oct. 27, 2020

(54) DISPLAY DEVICE INCLUDING DISPLAY UNIT HAVING INDENTED SHAPE

(71) Applicant: Samsung Display Co., Ltd., Yongin-Si, Gyeonggi-Do (KR)

(72) Inventors: Minjun Jang, Yongin-si (KR); Sunghoon Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/562,277

(22) Filed: Sep. 5, 2019

(65) Prior Publication Data
US 2020/0084890 A1 Mar. 12, 2020

(30) Foreign Application Priority Data

Sep. 6, 2018 (KR) .......................... 10-2018-0106748

(51) Int. Cl.
| H05K 1/00 | (2006.01) |
| H05K 1/18 | (2006.01) |
| H01L 27/32 | (2006.01) |
| H05K 1/14 | (2006.01) |
| H01L 51/52 | (2006.01) |
| H01L 51/00 | (2006.01) |

(52) U.S. Cl.
CPC ......... *H05K 1/189* (2013.01); *H01L 27/3223* (2013.01); *H01L 27/3276* (2013.01); *H01L 51/0096* (2013.01); *H01L 51/5253* (2013.01); *H05K 1/147* (2013.01); *H05K 2201/056* (2013.01); *H05K 2201/10128* (2013.01)

(58) Field of Classification Search
USPC ......................................................... 361/749
See application file for complete search history.

(56) References Cited

U.S. PATENT DOCUMENTS

| 9,894,781 B2 | 2/2018 | Franklin et al. |
| 10,126,616 B2 | 11/2018 | Watanabe et al. |
| 10,171,636 B2 | 1/2019 | Yeo et al. |
| 2016/0093596 A1 | 3/2016 | Hong et al. |
| 2016/0111040 A1 | 4/2016 | Kim et al. |
| 2016/0179139 A1 | 6/2016 | Ahn et al. |

(Continued)

FOREIGN PATENT DOCUMENTS

| CN | 108416280 A | 8/2018 |
| JP | 2018017981 A | 2/2018 |

(Continued)

*Primary Examiner* — Andargie M Aychillhum
(74) *Attorney, Agent, or Firm* — Innovation Counsel LLP

(57) ABSTRACT

A display device includes: a substrate including a first indented portion indented inward along one side of the substrate; a first pad group and a second pad group that are spaced apart from each other on the substrate along the one side; a display unit located on the substrate and having a shape indented inward between the first pad group and the second pad group; an encapsulation layer encapsulating the display unit; a first wiring film including a third pad group connected to the first pad group; and a second wiring film including a fourth pad group connected to the second pad group. The first wiring film and the second wiring film are bent from a first surface of the substrate to a second surface of the substrate that is opposite to the first surface of the substrate, and the second wiring film is spaced apart from the first wiring film.

22 Claims, 16 Drawing Sheets

(56) References Cited

U.S. PATENT DOCUMENTS

| | | | |
|---|---|---|---|
| 2017/0242457 A1 | 8/2017 | Lee et al. | |
| 2017/0287992 A1 | 10/2017 | Kwak et al. | |
| 2017/0352311 A1 | 12/2017 | Lee et al. | |
| 2018/0040576 A1 | 2/2018 | Kim et al. | |
| 2018/0090061 A1 | 3/2018 | Kim et al. | |
| 2019/0163304 A1* | 5/2019 | Shim | H01L 27/124 |
| 2019/0267434 A1 | 8/2019 | Liu et al. | |
| 2020/0083299 A1* | 3/2020 | Kim | H01L 51/5284 |

FOREIGN PATENT DOCUMENTS

| | | |
|---|---|---|
| KR | 10-1754075 B1 | 7/2017 |
| KR | 10-2017-0111827 A | 10/2017 |
| KR | 10-2017-0112790 A | 10/2017 |
| KR | 10-2017-0136683 A | 12/2017 |

* cited by examiner

DISPLAY DEVICE INCLUDING DISPLAY UNIT HAVING INDENTED SHAPE

CROSS-REFERENCE TO RELATED APPLICATION

This application claims the benefit of and priority to Korean Patent Application No. 10-2018-0106748, filed on Sep. 6, 2018, in the Korean Intellectual Property Office, the disclosure of which is incorporated herein in its entirety by reference.

BACKGROUND

1. Field

One or more embodiments of the present disclosure relate to a display device, and more particularly, to a display device including a display unit having an indented shape.

2. Description of the Related Art

There is an increasing demand for large screens in portable display devices including a display unit, such as mobile phones, tablet personal computers, game consoles, etc.

Meanwhile, to meet various demands of consumers, peripheral components or devices such as a camera module, a speaker, and a sensor that expand and support features of a display device need to be provided with or installed on display units of portable display devices.

SUMMARY

The present disclosure provides a display device including a display unit having an indented shape. The display unit has a form factor that can easily provide a plurality of components, particularly for a display unit having a large screen.

One or more embodiments of the present disclosure include a display device on which various components may be installed while simultaneously implementing a large screen. However, it should be understood that embodiments described herein should be considered in a descriptive sense only and not for limitation of the present disclosure.

Additional aspects will be set forth in part in the description which follows and, in part, will be apparent from the description, or may be learned by practice of the exemplary embodiments presented herein.

According to one or more embodiments, a display device includes: a substrate including a first indented portion indented inward along one side of the substrate; a first pad group and a second pad group that are spaced apart from each other on the substrate along the one side; a display unit located on the substrate and having a shape indented inward between the first pad group and the second pad group; an encapsulation layer encapsulating the display unit; a first wiring film including a third pad group connected to the first pad group, the first wiring film being bent from a first surface of the substrate to a second surface of the substrate that is opposite to the first surface of the substrate; and a second wiring film including a fourth pad group connected to the second pad group, the second wiring film being bent from the first surface of the substrate to the second surface of the substrate and spaced apart from the first wiring film.

The display device may further include: a flexible printed circuit board connected to the first wiring film and the second wiring film.

The flexible printed circuit board may include an integrated circuit chip that overlaps the display unit.

The encapsulation layer may include at least one inorganic layer and at least one organic layer.

The encapsulation layer may include at least one inorganic layer and at least one organic layer, an outermost layer of the encapsulation layer may be an inorganic layer, and the inorganic layer may cover a lateral surface of the at least one organic layer.

The encapsulation layer may include at least one inorganic layer and at least one organic layer, an outermost layer of the encapsulation layer may be an inorganic layer, and the inorganic layer may cover a lateral surface of the substrate in which the first indented portion is provided.

A dummy pixel for testing may be arranged outside the display unit along the first indented portion.

A first grounding portion grounded to the first wiring film and a second grounding portion grounded to the second wiring film may be respectively arranged on the first wiring film and the second wiring film.

A transparent substrate may be arranged on the encapsulation layer.

A black matrix may be arranged on the transparent substrate at a location corresponding to an outside of the display unit.

A first opening may be provided in the black matrix at a location corresponding to the first indented portion.

A second opening may be provided in the transparent substrate at a location corresponding to the first opening.

The display device may further include a polarization film between the encapsulation layer and the transparent substrate.

The display device may further include an adhesive film between the polarization film and the transparent substrate.

The display device may further include a filling material spaced apart from the adhesive film and surrounding a periphery of the display unit, the filling material being located between the substrate and the transparent substrate.

The display device may further include a cover panel arranged on the second surface of the substrate and including a buffer material.

An end of the cover panel may coincide with an end of the substrate at the first indented portion.

An end of the cover panel may protrude further to an outer side of the display unit than an end of the substrate at the first indented portion.

Each of the first pad group and the second pad group may include a plurality of pad wirings having oblique lines such that the plurality of pad wiring are symmetric with respect to a center of the first indented portion.

Each of the third pad group and the fourth pad group may include a plurality of pad wirings having oblique lines such that the plurality of pad wirings are symmetric with respect to a center of the first indented portion.

A maximum depth from an edge of a bent region of the first and second wiring film to the flexible printed circuit board may be equal to or greater than a maximum depth from the edge of the bent region of the first and second wiring film to the first indented portion.

The flexible printed circuit board may include a second indented portion facing the first indented portion and indented inward between the first wiring film and the second wiring film.

A distance from one end of the first wiring film to the flexible printed circuit board may be equal to or greater than a distance from an end of the first indented portion of the substrate to an end of the substrate.

According to one or more embodiments, a display device includes: a substrate including a first indented portion indented inward along one side of the substrate; a first pad group and a second pad group that are spaced apart from each other on the substrate along the one side; a display unit located on the substrate and having a shape indented inward between the first pad group and the second pad group; an encapsulation layer encapsulating the display unit; a first wiring film including a third pad group connected to the first pad group, the first wiring film being bent from a first surface of the substrate to a second surface of the substrate; a second wiring film including a fourth pad group connected to the second pad group, the second wiring film being bent from the first surface of the substrate to the second surface of the substrate that is opposite to the first surface of the substrate; and a first connection wiring film connecting the first wiring film to the second wiring film and located between the third pad group and the fourth pad group.

The display device may further include a second connection wiring film arranged at a location facing the first connection wiring film, wherein the first and second wiring films and the first and second connection wiring films may form a through hole.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
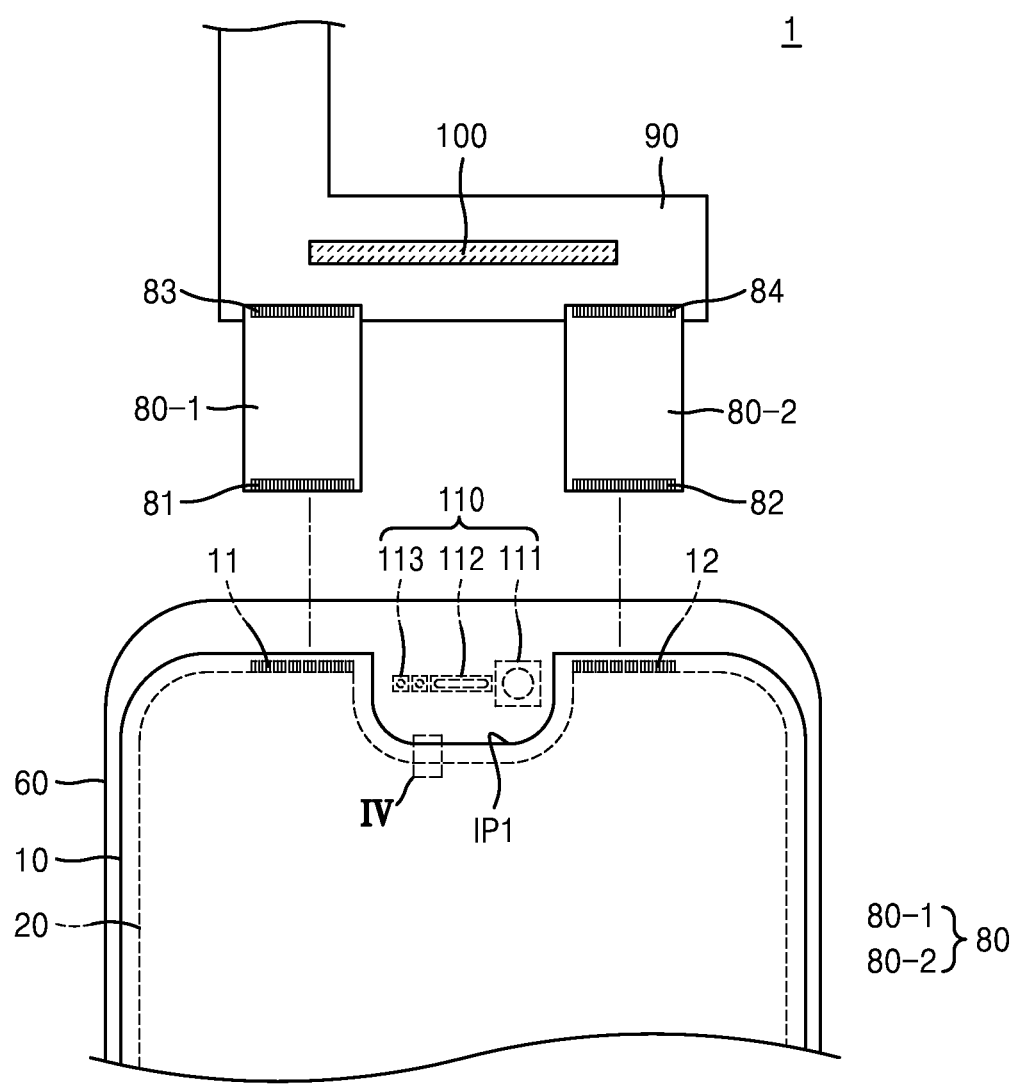
FIGS. 1A to 1C are plan views of a process of connecting a substrate to a wiring film in a display device according to an embodiment.

As the present disclosure allows for various changes and numerous embodiments, exemplary embodiments will be illustrated in the drawings and described in detail in the written description. Effects and characteristics of the present disclosure, and one or more methods of accomplishing these will be apparent when referring to the exemplary embodiments described with reference to the drawings. The present disclosure may, however, be embodied in many different forms and should not be construed as limited to the exemplary embodiments set forth herein.

Hereinafter, the present disclosure will be described more fully with reference to the accompanying drawings, in which the exemplary embodiments of the present disclosure are shown. When description is made with reference to the drawings, like reference numerals in the drawings denote like or corresponding elements, and repeated description thereof will be omitted.

As used herein, the term "and/or" may include any and all combinations of one or more of the associated listed items.

Expressions such as "at least one of" when preceding a list of elements, may modify the entire list of elements and may not modify the individual elements of the list.

It will be understood that when a layer, region, or component is referred to as being "formed (located, arranged, disposed, positioned, etc.) on" another layer, region, or component, it can be directly or indirectly formed (located, arranged, disposed, positioned, etc.) on the other layer, region, or component. That is, for example, one or more intervening layers, regions, or components may be present therebetween. Sizes of elements in the drawings may be exaggerated for convenience of explanation. In other words, since sizes and thicknesses of components in the drawings may be arbitrarily illustrated for convenience of explanation, the following embodiments are not limited thereto.

Figure 1B:
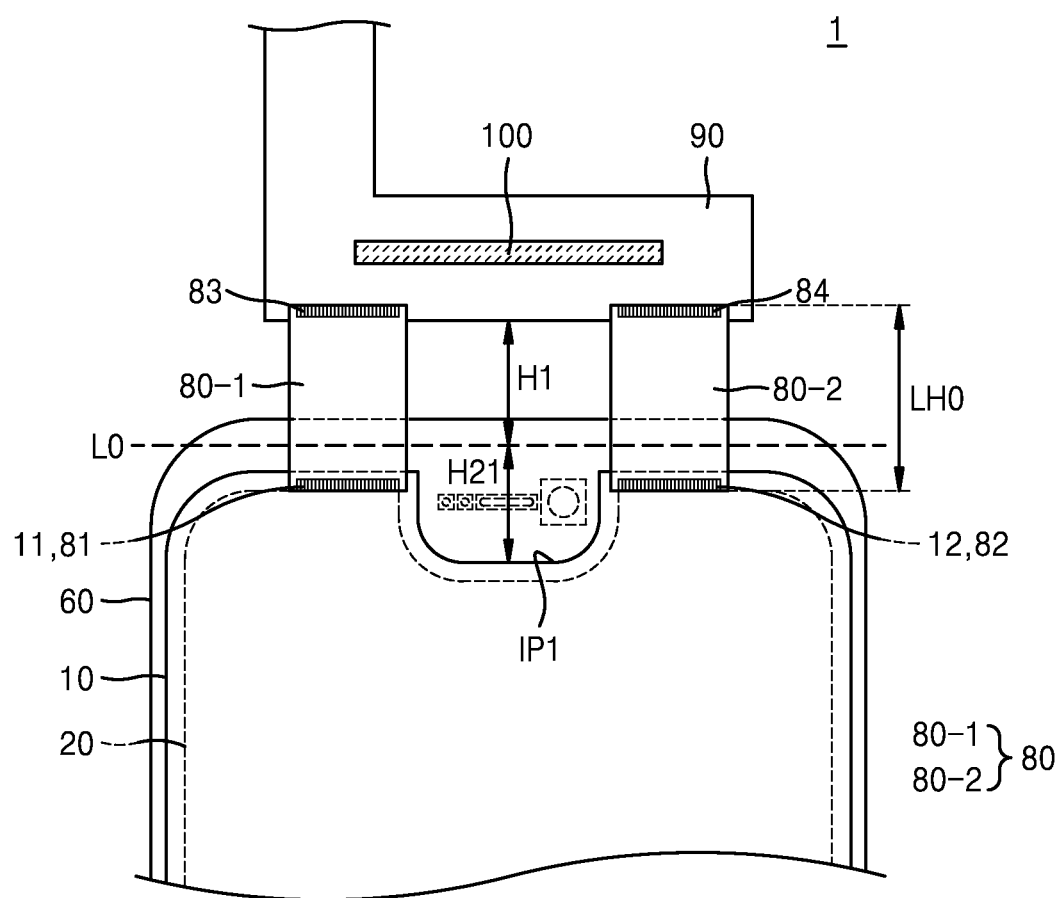
Figure 1C:
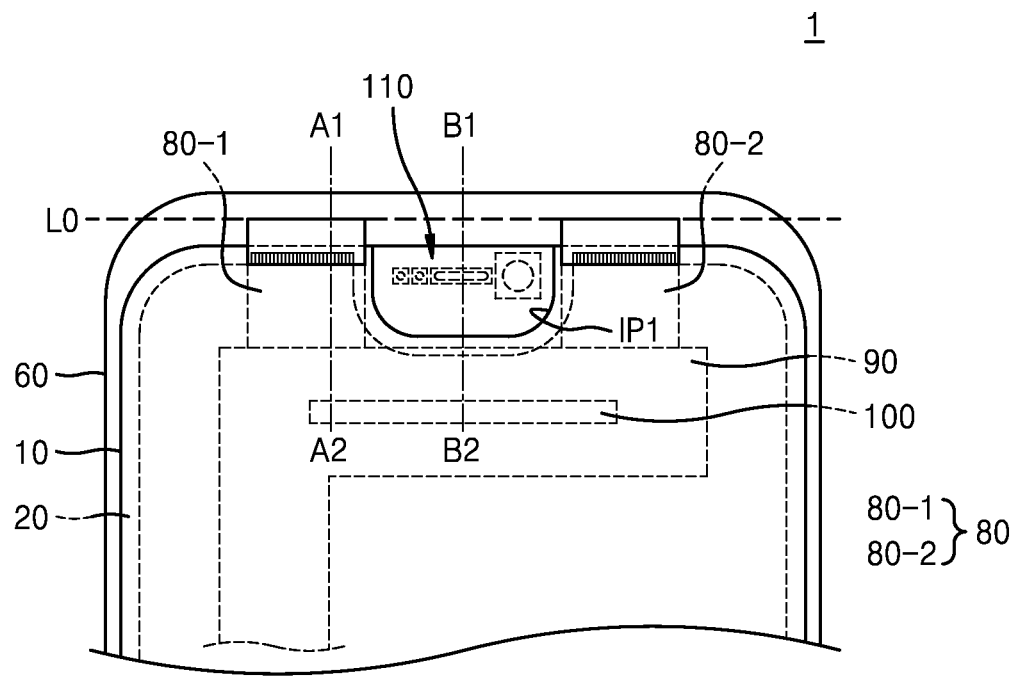
Figure 2:
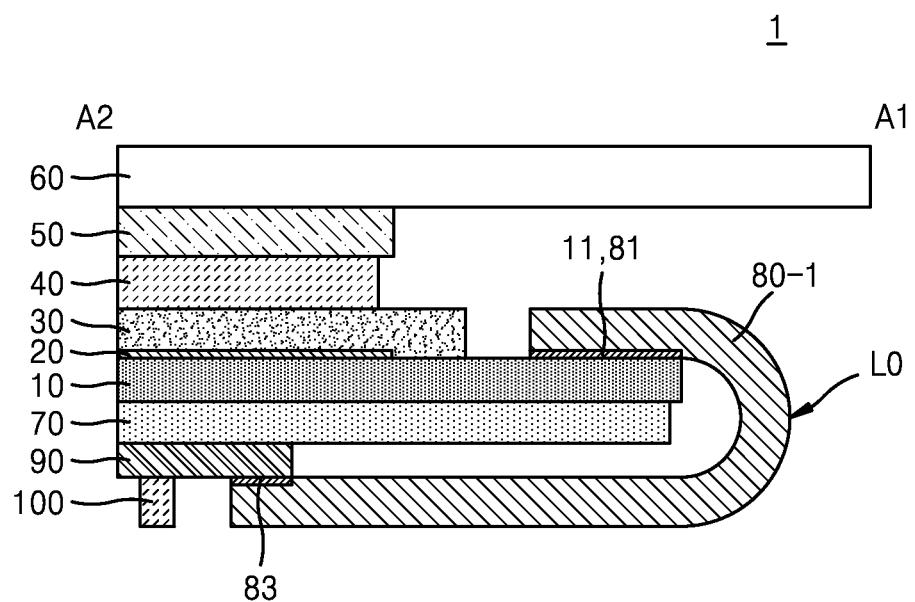
FIG. 2 is a cross-sectional view of a portion of a display device taken along line A1-A2 of FIG. 1C.
Figure 3:
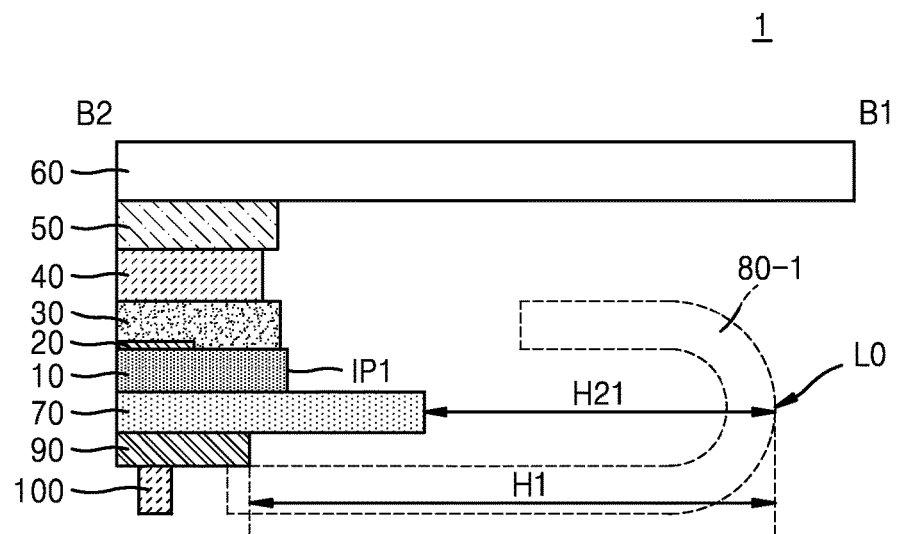
FIG. 3 is a cross-sectional view of a portion of a display device taken along line B1-B2 of FIG. 1C.
Figure 4:
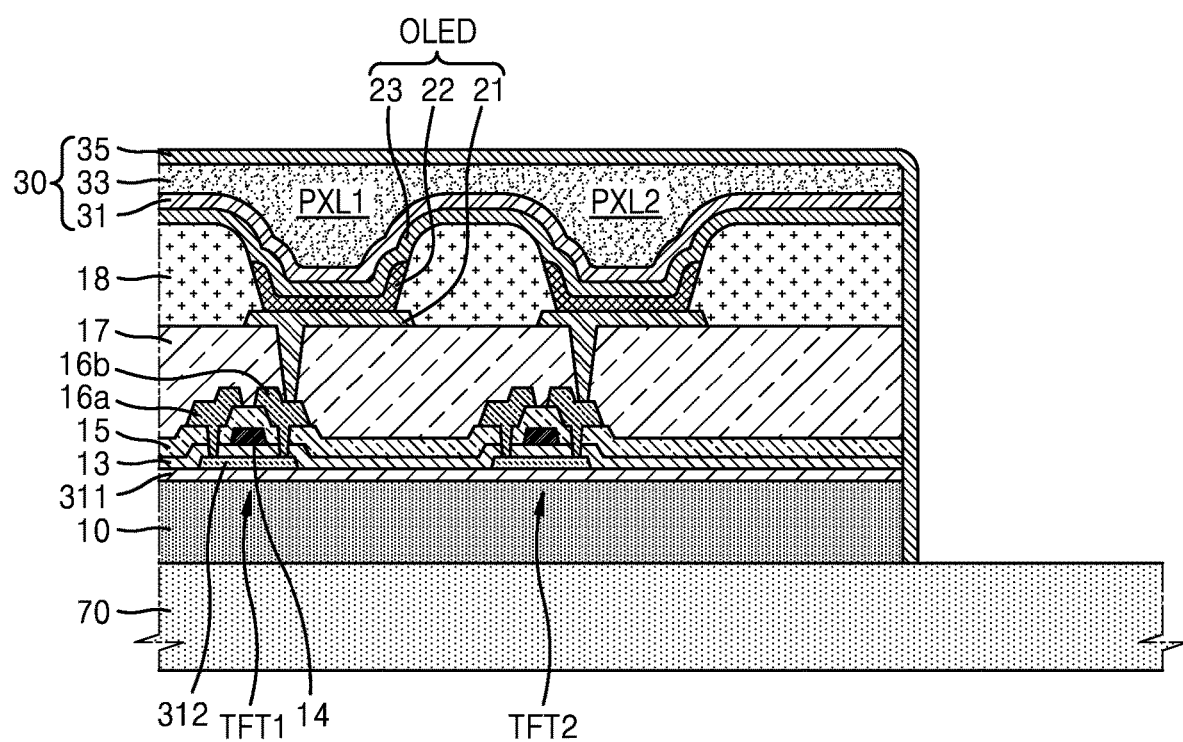
FIG. 4 is a cross-sectional view of portion IV of FIG. 1A.

FIGS. 1A to 1C are plan views of a process of connecting a substrate 10 to a wiring film 80 in a display device 1 according to an embodiment, FIG. 2 is a cross-sectional view of a portion of the display device 1 taken along line A1-A2 of FIG. 1C, FIG. 3 is a cross-sectional view of a portion of the display device 1 taken along line B1-B2 of FIG. 1C, and FIG. 4 is a cross-sectional view of portion IV of FIG. 1A.

Referring to FIGS. 1A to 4, the display device 1 according to an embodiment includes the substrate 10 including a first indented portion IP1 that is indented inward along one side of the substrate 10, a first pad group 11 and a second pad group 12 that are arranged on the substrate 10 as being spaced apart from each other along one side of the substrate 10, a display unit 20 that has a shape indented inward between the first pad group 11 and the second pad group 12, an encapsulation layer 30 that encapsulates the display unit 20, a third pad group 81 that is connected to the first pad group 11, a first wiring film 80-1, a fourth pad group 82 that is connected to the second pad group 12, and a second wiring film 80-2 that is spaced apart from the first wiring film 80-1. The first wiring film 80-1 and the second wiring film 80-2 may be collectively referred to as the wiring film 80. Referring to FIGS. 1B and 1C, the first wiring film 80-1 and the second wiring film 80-2 are bent from one side of the substrate 10 to another side of the substrate 10.

The substrate 10 may include various materials such as a glass material, a metal material, or a plastic material. For example, the substrate 10 may include a flexible substrate including, but not limited to, a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP).

The substrate 10 includes the first indented portion IP1 that is indented inward from one side of the substrate 10 to an inside of the substrate 10. The first indented portion IP1 may be formed by cutting the substrate 10 using, for example, a cutting process using a laser beam.

A component 110 that may provide one or more features of the display device 1 may be arranged in the first indented portion IP1 of the substrate 10. Examples of the component 110 include, but are not limited to, a camera module 111, a speaker 112, and a sensor 113. Herein, the component 110 collectively refers to one or more of the camera module 111, the speaker 112, and the sensor 113, and any other component that may be arranged in the first indented portion IP1 of the substrate 10. Examples of the sensor 113 include, but are not limited to, a proximity sensor, an illumination sensor, an acceleration sensor, and a bio sensor.

The first pad group 11 and the second pad group 12 are arranged to be spaced apart from each other on the substrate 10. For example, the first pad group 11 and the second pad group 12 are arranged on two opposite sides of a region in which the first indented portion IP1 is formed.

Each of the first pad group 11 and the second pad group 12 includes a plurality of wirings that include a conductive material. Each of the first pad group 11 and the second pad group 12 may be connected to various wirings (not shown), for example, a scan line, a data line, and a power line that are connected to a plurality of pixels (not shown) arranged in the display unit 20 and may transfer signals to the display unit 20.

The display unit 20 may include the plurality of pixels (not shown) that may display an image. Each of the pixels may include a display element such as an organic light-emitting diode, a liquid crystal element, an electrophoretic element, and a micro inorganic light-emitting diode. The present embodiment provides a display device that includes an organic light-emitting diode OLED (see FIG. 4) as an example of the display element.

In the present embodiment, the display unit 20 includes a display screen that has an indented shape at least on one side, which is different from a quadrangular display screen in which four sides are substantially straight. The first indented portion IP1 has a predetermined shape and a dimension (e.g., width and height) measured from an edge of the display unit 20.

The encapsulation layer 30 is arranged on the display unit 20. The encapsulation layer 30 is wider than the display unit 20 to cover an edge of the display unit 20 and prevents external impurities from penetrating into the display unit 20.

After the first pad group 11 and the second pad group 12 of the substrate 10 are respectively aligned with the third pad group 81 of the first wiring film 80-1 and the fourth pad group 82 of the second wiring film 80-2 (see FIG. 1A) and connected to each other (see FIG. 1B), each of the first and second wiring films 80-1 and 80-2 is bent from one side of the substrate 10 to another side of the substrate 10 (see FIG. 1C).

Each of the first and second wiring films 80-1 and 80-2 may include a flexible resin such as a polyimide resin and an epoxy-based resin to facilitate bending. Each of the third pad group 81 and the fourth pad group 82 respectively of the first wiring film 80-1 and the second wiring film 80-2 may include a plurality of wirings that includes a conductive material.

A conductive bonding layer (not shown) such as an anisotropic conductive film may be arranged between the first pad group 11 of the substrate 10 and the third pad group 81 of the first wiring film 80-1 and between the second pad group 12 of the substrate 10 and the fourth pad group 82 of the second wiring film 80-2, and the substrate 10 is solidly physically bonded on and electrically connected to the first and second wiring films 80-1 and 80-2 by compression.

In the present embodiment, the first wiring film 80-1 and the second wiring film 80-2 have a length LH0 and are spaced apart from each other.

A fifth pad group 83 is arranged on one side of the first wiring film 80-1 that faces the third pad group 81, and a sixth pad group 84 is arranged on one side of the second wiring film 80-2 that faces the fourth pad group 82.

The first wiring film 80-1 and the second wiring film 80-2 may be connected to a flexible printed circuit board 90 respectively through the fifth pad group 83 and the sixth pad group 84.

The first wiring film 80-1 and the second wiring film 80-2 may include a material that is more flexible than that of the flexible printed circuit board 90 and may be formed to be thinner than the flexible printed circuit board 90 to reduce bending stress.

Since the first wiring film 80-1 and the second wiring film 80-2 are spaced apart from each other with the first indented portion IP1 therebetween, when the first wiring film 80-1 and the second wiring film 80-2 are connected to the substrate 10 and then bent, the first wiring film 80-1 and the second wiring film 80-2 do not interfere with a space in which the component 110 may be arranged.

Figure 10:
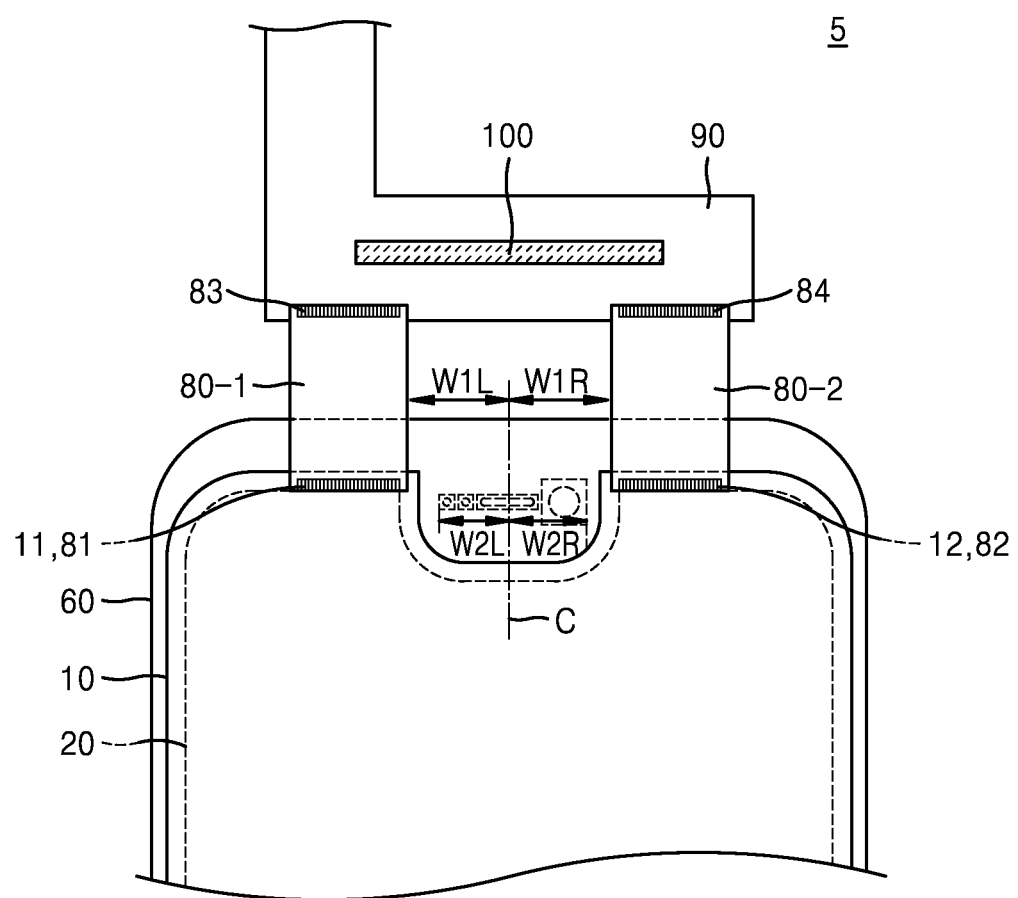
FIG. 10 is a plan view of a portion of a display device according to another embodiment.

Referring to FIGS. 1B and 3, a maximum depth H1 measured from an edge L0 to the flexible printed circuit board 90 may be equal to or greater than a maximum depth H21 measured from the edge L0 to an end of a cover panel 70. The edge L0 refers to an outer edge of the first wiring film 80-1 and the second wiring film 80-2 when they are bent to be connected to the cover panel 70 formed on the substrate 10 as indicated in FIGS. 10,2, and 3.

Referring to FIG. 3, the end of the cover panel 70 may protrude further from the first indented portion IP1 toward an outer edge of the display device 1 than an end of the substrate 10. The end of the cover panel 70 does not need to have the same shape as that of the first indented portion IP1. Since the end of the cover panel 70 protrudes further to the outer edge of the display device 1 than the end of the substrate 10, the cover panel 70 stably supports the substrate 10 while the first wiring film 80-1 is bonded on the substrate 10.

In the present embodiment, the maximum depth H1 measured from the edge L0 to the flexible printed circuit board 90 may be equal to or greater than the maximum depth H21 measured from the edge L0 to the end of the cover panel 70. The component 110 (see FIG. 1C) may be arranged in a space between the edge L0 and the end of the cover panel 70.

An integrated circuit chip 100 is mounted on the flexible printed circuit board 90. The integrated circuit chip 100 may be arranged on a rear side of the substrate 10 as being spaced apart from the first indented portion IP1. Therefore, even when the first and second wiring films 80-1 and 80-2 are bent, the integrated circuit chip 100 is arranged away from the first indented portion IP1 in a plan view to overlap the display unit 20 without causing interference with the space in which the component 110 may be arranged.

The integrated circuit chip 100 may include at least one of a scan driving circuit chip, a data driving circuit chip, and a power driving circuit chip.

A plurality of wirings (not shown) may be arranged between the integrated circuit chip 100 and the third and fourth pad groups 81 and 82 to transfer a signal of the integrated circuit chip 100 to the display unit 20 through the first pad group 11 and the second pad group 12.

The cover panel 70 that supports the substrate 10 may be arranged on a rear side of the substrate 10. The first and second wiring films 80-1 and 80-2 are bent to connect the flexible printed circuit board 90 to a rear side of the cover panel 70.

The cover panel 70 may include a cushion tape layer (not shown) that absorbs an impact of the rear side of the substrate 10 and a black tape layer (not shown) that prevents light leakage from the rear side of the substrate 10.

FIG. 4 is a cross-sectional view of a structure of the substrate 10, the display unit 20, the encapsulation layer 30, and the cover panel 70 around the first indented portion IP1.

In an embodiment in which the display unit 20 includes an organic light-emitting diode OLED, the encapsulation layer 30 includes a plurality of thin layers 31, 33, and 35.

A first thin film transistor TFT1 including a semiconductor layer 312, a gate electrode 14, a source electrode 16*a*, and a drain electrode 16*b* is arranged on the substrate 10.

A buffer layer 311 is arranged between the substrate 10 and the semiconductor layer 312, and a gate insulating layer 13 is arranged between the semiconductor layer 312 and the gate electrode 14. An interlayer insulating layer 15 is arranged between the gate electrode 14 and the source and drain electrodes 16*a* and 16*b*, and a planarization layer 17 covers the interlayer insulating layer 15 and the source and drain electrodes 16*a* and 16*b*.

Each of the buffer layer 311, the gate insulating layer 13, and the interlayer insulating layer 15 may include an inorganic material such as silicon oxide, silicon nitride, and/or silicon oxynitride. The planarization layer 17 may include an inorganic layer and/or an organic layer.

A structure of the first thin film transistor TFT1 and a structure and a material of the insulating layers (e.g., the gate insulating layer 13 and the interlayer insulating layer 15) shown in FIG. 4 are provided as an example to which the present disclosure is applicable. It is noted that the present disclosure is not limited to the structure of the first thin film transistor TFT1 and the insulating layers shown in FIG. 4.

The first thin film transistor TFT1 serves as a driving transistor and is connected to a pixel electrode 21 to transfer a driving signal. Ends of the pixel electrode 21 are surrounded by a pixel-defining layer 18 that may include an organic insulating layer. The pixel-defining layer 18 may prevent an arc from occurring at the ends of the pixel electrode 21.

A second thin film transistor TFT2 may be used as a transistor for testing a performance of a device rather than being used as a driving transistor. The second thin film transistor TFT2 may have the same structure as that of the first thin film transistor TFT1.

An intermediate layer (not shown) including an organic emission layer 22 may be arranged on the pixel electrode 21. The organic emission layer 22 may include a low molecular organic emission material or a polymer organic emission material. In a case where the organic emission layer 22 includes a low molecular material, the intermediate layer may further include at least one of a hole injection layer, a hole transport layer, an electron transport layer, and an electron injection layer. In a case where the organic emission layer 22 includes a polymer material, the intermediate layer may further include a hole transport layer.

An opposite electrode 23 provided in common on a plurality of pixels PXL1 and PXL2 may be arranged on the organic emission layer 22.

The organic light-emitting diode OLED including the pixel electrode 21, the organic emission layer 22, and the opposite electrode 23 is a self-luminous display element that emits light while an exciton falls from an excited state to a ground state, the exciton being generated when a hole injected from a hole injection electrode and an electron injected from an electron injection electrode combine in the organic emission layer 22. Since the organic light-emitting diode OLED may be configured in a lightweight slim profile, the display device 1 including the organic light-emitting diode OLED may be used for a portable display device.

In FIG. 4, the first pixel PXL1 that is arranged close to an inside of the display unit 20 corresponds to a pixel in a display area that emits light based on the above-described operating principle and displays an image of the display device 1. In contrast, the second pixel PXL2 that is arranged close to the first indented portion IP1 from an edge of the substrate 10 may be a dummy pixel that does not display an image.

The second thin film transistor TFT2 may be connected to the second pixel PXL2. The dummy pixel may be used for a signal test, an aging test, etc. and may also be used as a barrier or a buffer for reducing a defect of the display device 1.

Since the second pixel PXL2 may be damaged while the first indented portion IP1 is cut, the second pixel PXL2 may be utilized as a space used for a test or a barrier or a buffer to reduce a potential damage instead of being used as a pixel that displays an image.

The encapsulation layer 30 that encapsulates the display unit 20 may include a plurality of thin film layers. For example, in the present embodiment, the encapsulation layer 30 may have a structure in which a first inorganic layer 31, a first organic layer 33, and a second inorganic layer 35 are sequentially stacked. The encapsulation layer 30 is not limited to the present example including the three layers and may include at least one inorganic layer and at least one organic layer. Various modifications to the encapsulation layer 30 may be made without deviating from the scope of the present disclosure.

The first inorganic layer 31 and the second inorganic layer 35 may include silicon oxide, silicon nitride, and/or silicon oxynitride. The first organic layer 33 may include at least one of polyethylene terephthalate (PET), polyethylene naphthalate (PEN), polycarbonate (PC), polyimide, polyethylene sulfonate, polyoxymethylene, polyarylate, polyacrylate, and hexamethyldisiloxane (HMDSO).

The first inorganic layer 31 may be curved depending on a structure thereunder, a surface of the first inorganic layer 31 is not flat. The first organic layer 33 may planarize a top surface of the encapsulation layer 30 by covering the first inorganic layer 31 that may not be flat. The second inorganic layer 35 covers the first organic layer 33.

As described above, when a crack may occur inside the encapsulation layer 30, cracks occurred between the first inorganic layer 31 and the first organic layer 33 and between the first organic layer 33 and the second inorganic layer 35 may not be connected to each other through the multi-layered structure of the encapsulation layer 30. Therefore, the multi-layered structure of the encapsulation layer 30 may prevent or reduce forming of a path through which external moisture or impurities such as oxygen may penetrate into the display unit 20.

Meanwhile, the outermost layer of the encapsulation layer 30, e.g., the second inorganic layer 35, may be made of an inorganic material to prevent transmission of external moisture. In the present example, an end of the first organic layer 33 may be covered by the second inorganic layer 35. FIG. 4 shows an example in which the second inorganic layer 35 covers a lateral surface of the substrate 10 along the periphery of the first indented portion IP1.

Therefore, according to the present embodiment, one or more pixels that display an image are not directly exposed to a cut surface of the substrate 10 when forming the first indented portion IP1 by arranging the dummy pixel PXL2 at a portion of the display unit 20 that neighbors the first indented portion IP1. In addition, the encapsulation layer 30 includes at least one inorganic layer and at least one organic layer, an outermost layer of the encapsulation layer 30 includes an inorganic layer and covers an end of the organic layer of the encapsulation layer 30. Therefore, the outermost inorganic layer of the encapsulation layer 30 covers an end of the organic layer of the encapsulation layer 30 to prevent the organic layer from being directly exposed to the outside during a cutting process and hence prevent transmission of moisture through the lateral surface of the substrate 10 even after the cutting process.

Figure 5A:
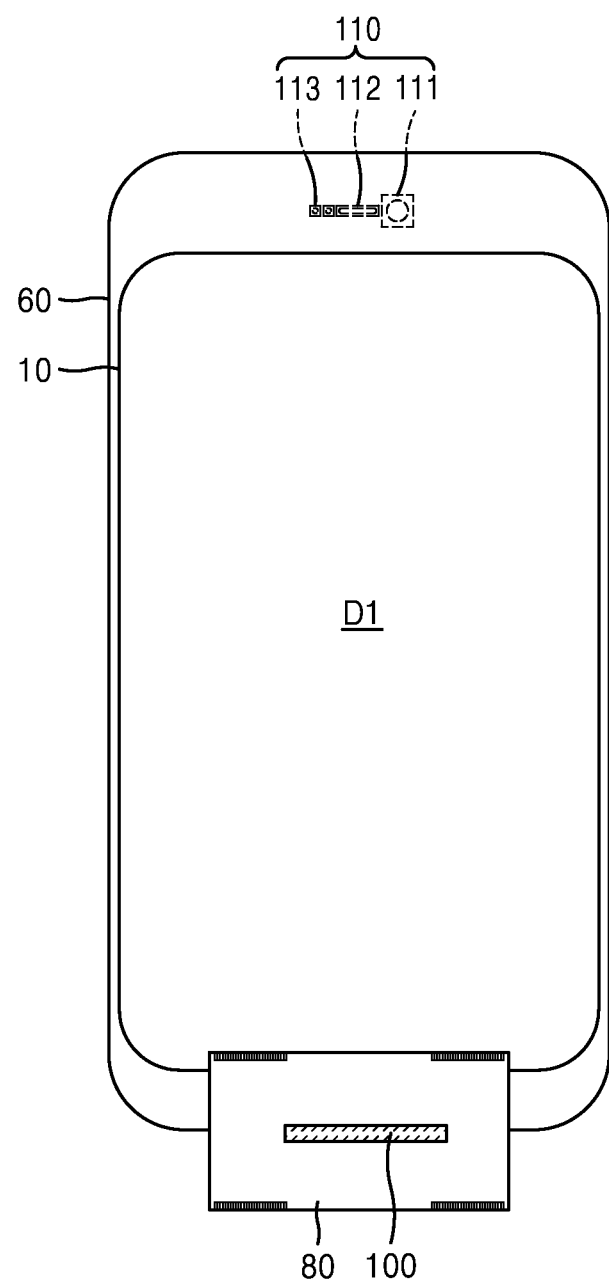
FIGS. 5A to 5C are plan views for comparing a display area of a display device according to an embodiment with a display area of comparative display devices.
Figure 5B:
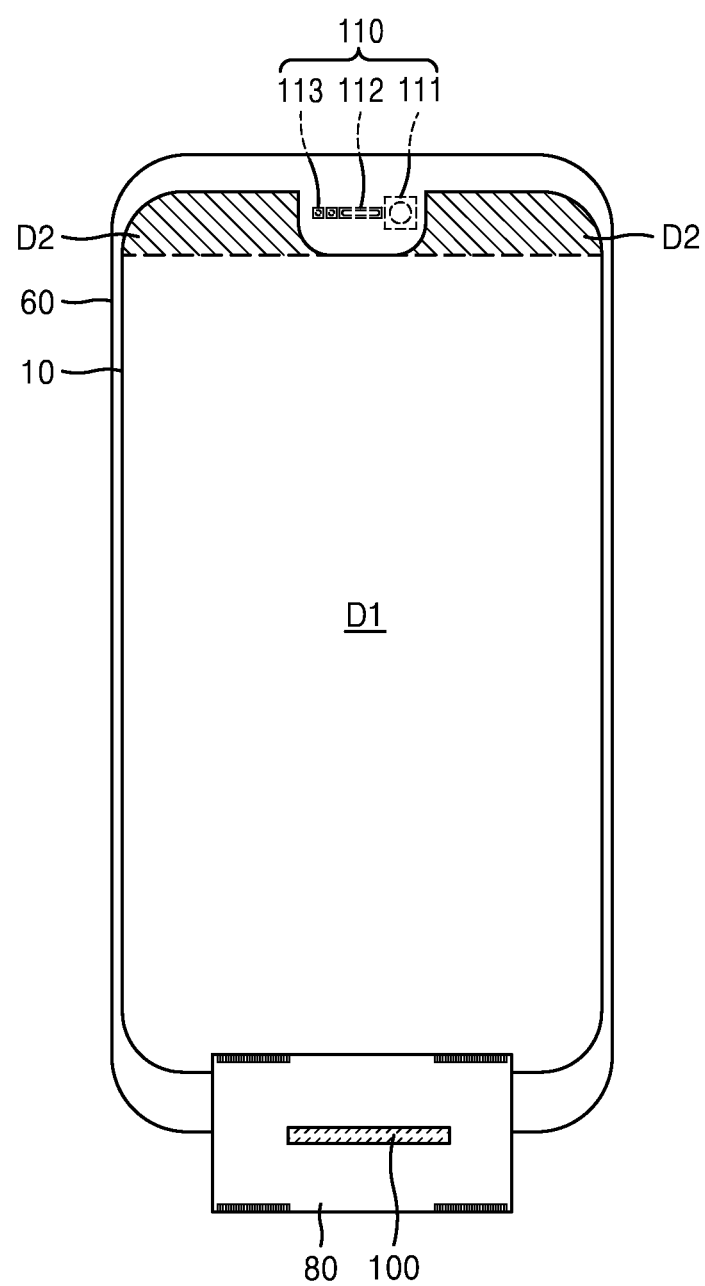
Figure 5C:
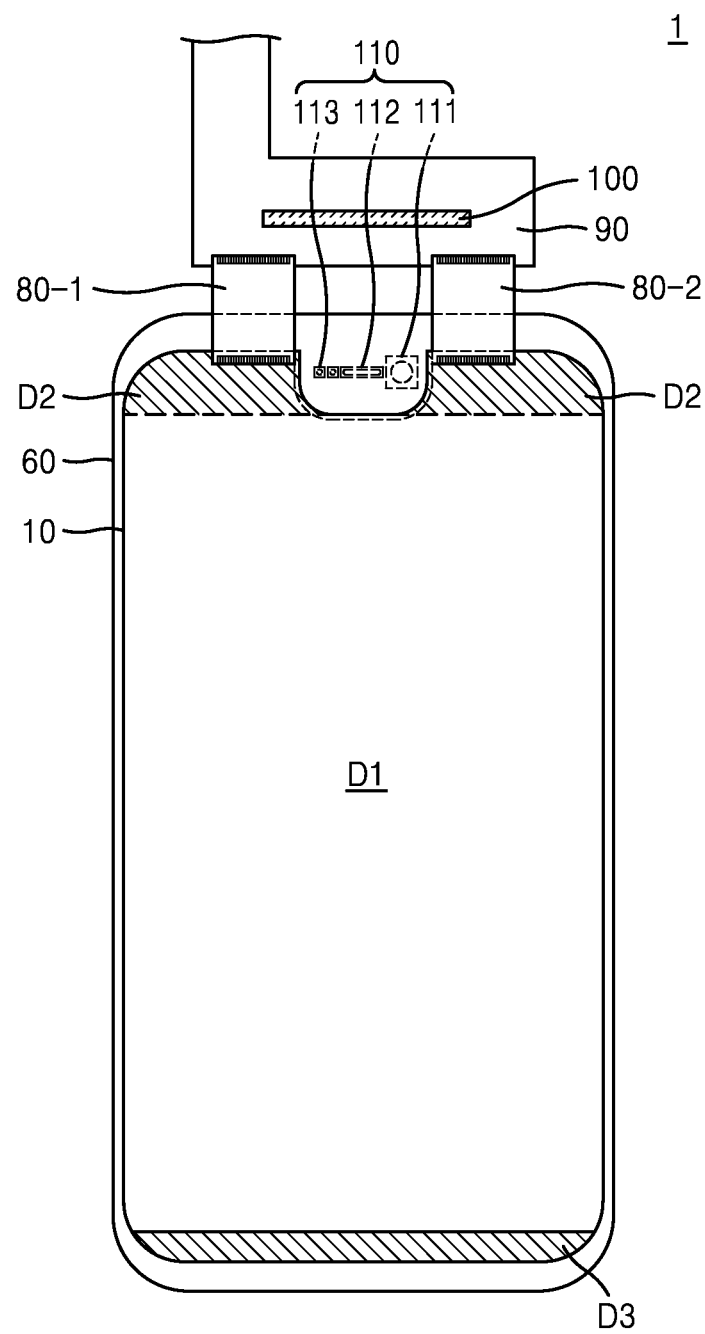

FIGS. 5A to 5C are plan views of comparing a display area of a display device according to an embodiment with a display area of comparative display devices.

FIG. 5A shows a display device according to a first comparative example. In the display device of FIG. 5A, the component 110 that may provide one or more features of the display device, such as a camera module 111, a speaker 112, and a sensor 113 is arranged at an upper end of the substrate 10, and the wiring film 80 that mounts the integrated circuit chip 100 thereon is arranged at a lower end of the substrate 10.

An approximate display area of the display device according to the comparative example is a first area D1 that excludes the upper end and the lower end of the substrate 10.

Though the first area D1 may correspond to an area of the display unit 20 that is provided inwardly more than the substrate 10, the substrate 10 is used for convenience of explaining the difference of the display areas between comparative examples in the following.

FIG. 5B shows a display device according to a second comparative example. In the display device of FIG. 5B, the first indented portion IP1 is formed at the upper end of the substrate 10, and the component 110 that may provide one or more features of the display device, such as the camera module 111, the speaker 112, and the sensor 113 is arranged in a cut space (e.g., the first indented portion IP1) of the substrate 10. Similar to the first comparative example of FIG. 5A, the wiring film 80 that includes the integrated circuit chip 100 is arranged at the lower end of the substrate 10.

An approximate display area of the display device according to the second comparative example of FIG. 5B is a sum of the first area D1 and a second area D2 of the upper end of the substrate 10 that excludes the first indented portion IP1. Therefore, the display area of the display device according to the second comparative example of FIG. 5B increases compared to the display area D1 of the display device according to the first comparative example of FIG. 5A.

FIG. 5C shows a display device 1 according to the present embodiment. In the display device 1 of FIG. 5C, the first wiring film 80-1 and the second wiring film 80-2 that are spaced apart from each other are arranged at the upper end of the substrate 10, and the component 110 that may provide one or more features of the display device 1, such as the camera module 111, the speaker 112, and the sensor 113 is arranged in a cut space (e.g., the first indented portion IP1) of the substrate 10 that is formed by the flexible printed circuit board 90, and the first and second wiring films 80-1 and 80-2. In addition, the first and second wiring films 80-1 and 80-2 and the flexible printed circuit board 90 that includes the integrated circuit chip 100 are arranged at the upper end of the substrate 10.

Therefore, an approximate display area of the display device 1 of FIG. 5C is a sum of the first area D1, the second area D2 that excludes the first indented portion IP1 at the upper end of the substrate 10, and a third area D3 that extends from the lower end of the substrate 10. Therefore, the display area of the display device 1 according to the present embodiment shown in FIG. 5C is increased compared to the display areas of the comparative examples shown in FIGS. 5A and 5B.

Therefore, the display device 1 of the present embodiment may facilitate mounting of one or more components thereon while enlarging a display area of the display device 1 by using a substrate that has an indented shape.

Referring FIGS. 2 and 3, a polarization film 40 may be arranged on the encapsulation layer 30.

According to one embodiment, the polarization film 40 may include a multi-linear polarization film and a circular polarizer film by bonding the films having a phase difference.

A transparent substrate 60 may be arranged on the polarization film 40, and an adhesive film 50 may be arranged between the polarization film 40 and the transparent substrate 60.

The transparent substrate 60 may include a transparent material. The transparent substrate 60 covers not only the display unit 20 but also an area in which the component 110 is arranged. The transparent substrate 60 may include a touchscreen panel that provides a touch-sensing feature on the display unit 20.

According to one embodiment, the polarization film 40 may be formed on the encapsulation layer 30 after a processing of cutting the first indented portion IP1. In this case, the polarization film 40 may be cut in advance to reflect the shape of the first indented portion IP1 and then arranged on the encapsulation layer 30.

According to one embodiment, after the process of cutting the first indented portion IP1, the adhesive film 50 may be formed on the polarization film 40. In this case, the adhesive film 50 may be first cut or coated to reflect the shape of the first indented portion IP1 and then the adhesive film 50 may be arranged on the polarization film 40. In another embodiment, the adhesive film 50 may be coated first on the transparent substrate 60, which will be described below, the adhesive film 50 may be arranged on the polarization film 40 together with the transparent substrate 60.

Figure 6:
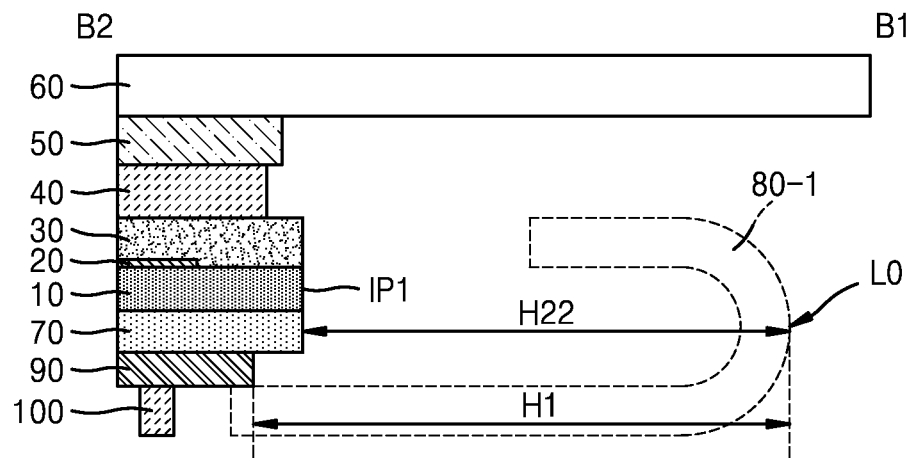
FIG. 6 is a cross-sectional view of a portion of a display device according to another embodiment.

FIG. 6 is a cross-sectional view of a portion of a display device 2 according to another embodiment. Differences between the display device 1 according to the embodiment of FIG. 3 and the display device 2 are mainly described.

Referring to FIG. 6, an end of the cover panel 70 is substantially coincide with an end of the substrate 10 at the first indented portion IP1.

A maximum depth H1 measured from an edge L0 to the flexible printed circuit board 90 may be substantially equal to or greater than a maximum depth H22 measured from the edge L0 to the first indented portion IP1 that is formed in the substrate 10.

In a case where the end of the cover panel 70 substantially coincides with the end of the substrate 10 at the first indented portion IP1, a space that may receive the component 110 may be maximized while the substrate 10 is still stably supported.

Figure 7:
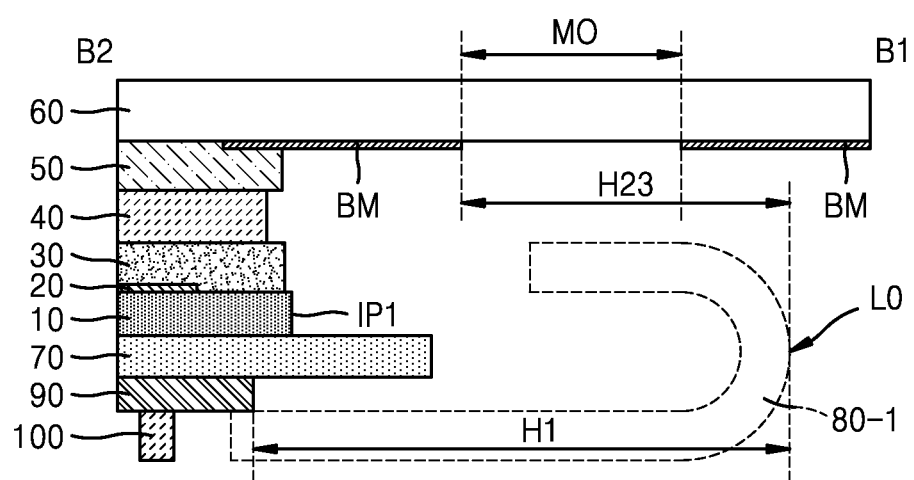
FIG. 7 is a cross-sectional view of a portion of a display device according to another embodiment.

FIG. 7 is a cross-sectional view of a portion of a display device 3 according to another embodiment. Differences between the display device 1 according to the embodiment of FIG. 3 and the display device 3 are mainly described.

Referring to FIG. 7, a black matrix BM is arranged on a surface of the transparent substrate 60 that faces the display unit 20. The black matrix BM may be arranged outside the display unit 20, and a module opening MO may be formed in a region where the component 110 (see FIG. 1C) are arranged. In other words, the module opening MO may be provided in the black matrix BM at a location corresponding to the first indented portion IP1. A light leakage through the region in which the component 110 (see FIG. 1C) is arranged may be prevented by the black matrix BM.

A maximum depth H1 measured from an edge L0 to the flexible printed circuit board 90 may be substantially equal to or greater than a maximum depth H23 measured from the edge L0 to a side of the module opening MO of the black matrix BM that is closer to the display unit 20. The component 110 (see FIG. 1C) may be arranged in a space formed by the module opening MO.

The cover panel 70 of the display device 3 may be freely designed as long as it does not overlap the module opening MO of the transparent substrate 60.

Meanwhile, though not shown in FIG. 7, a second opening (not shown) may be formed in a region of the transparent substrate 60 that corresponds to the module opening MO. Unlike the camera module 111 and the sensor 113, the speaker 112 may require the second opening (not shown) that is formed in the transparent substrate 60 to transfer sounds.

Figure 8:
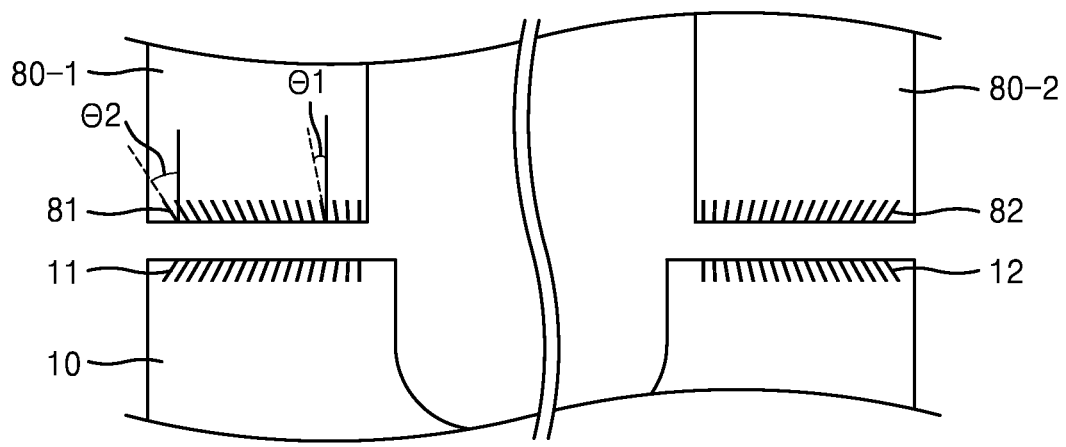
FIG. 8 is a plan view illustrating that wirings of first and second pad groups and third and fourth pad groups include oblique wirings, according to an embodiment.

FIG. 8 is a plan view illustrating that wirings of the first and second pad groups 11 and 12 and the third and fourth pad groups 81 and 82 include oblique wirings according to an embodiment.

When the substrate 10 is aligned with and bonded on the first and second wiring films 80-1 and 80-2, a conductive bonding layer (not shown) such as an anisotropic conductive film is arranged between the first pad group 11 of the substrate 10 and the third pad group 81 of the first wiring film 80-1 and between the second pad group 12 of the substrate 10 and the fourth pad group 82 of the second wiring film 80-2, and the substrate 10 is solidly physically bonded on and electrically connected to the first and second wiring films 80-1 and 80-2 by compression. In this case, during the compression, the anisotropic conductive film may not be aligned in a line and thus disconnection between the anisotropic conductive film and the wirings of the pad group may occur.

The present embodiment may prevent disconnection between the anisotropic conductive film and the pad group by forming the wirings of the first and second pad groups 11 and 12 and the third and fourth pad groups 81 and 82 in oblique line shapes. In one embodiment, the oblique lines have a slope that gradually increases from a first angle (e.g., 0° when measured with respect to a vertical line) to a second angle (e.g., Θ2) outwardly from a center. An angle Θ1 represent an arbitrary angle between the first angle and the second angle. A width of oblique lines may be constant, and a spatial interval between adjacent oblique lines may be kept constant.

Though FIG. 8 shows the wirings in oblique lines having a slope that gradually increases from the first angle to the second angle outwardly from a center, the present disclosure is not limited thereto. For example, the slope angle of the oblique lines may be constant. In another example, the slope angles may gradually decrease from the first angle to the second angle or gradually increase and decrease, or gradually decrease and increase outwardly from a center. In some embodiments, widths of the oblique lines and spatial intervals between adjacent oblique lines may vary.

Each of the first pad group 11 and the second pad group 12 may include a plurality of pad wirings having oblique lines such that the plurality of pad wirings are symmetric with respect to a center of the first indented portion IP1.

Each of the third pad group 81 and the fourth pad group 82 may include a plurality of pad wirings having oblique lines such that the plurality of pad wirings are symmetric with respect to the center of the first indented portion IP1.

Figure 9:
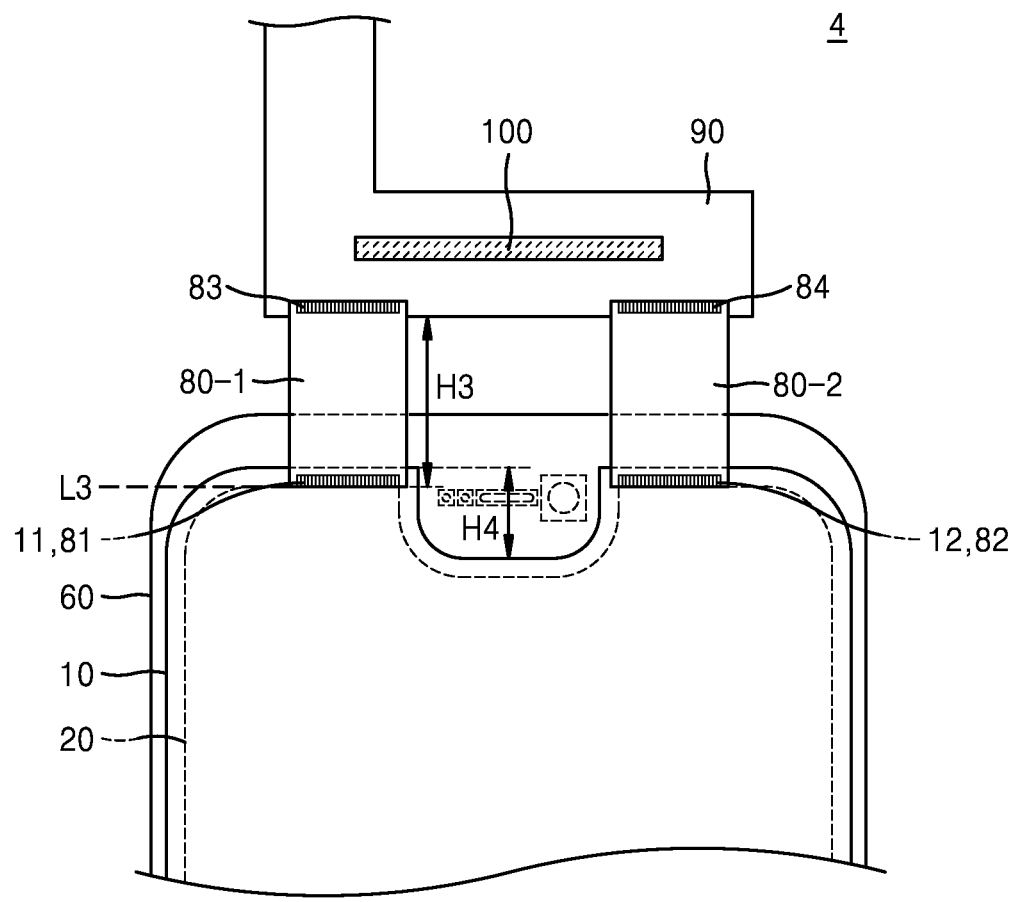
FIG. 9 is a plan view of a portion of a display device according to another embodiment.

FIG. 9 is a plan view of a portion of a display device 4 according to another embodiment. When compared to the display device 1 according to the embodiment of FIG. 1B, differences are mainly described.

A maximum depth H3 measured from an end L3 of the third pad group 81 of the first wiring film 80-1 and the fourth pad group 82 of the second wiring film 80-2 to the flexible printed circuit board 90 may be equal to or greater than a maximum depth H4 measured from an end of the substrate 10 to an end of the first indented portion IP1 formed in the substrate 10.

FIG. 10 is a plan view of a portion of a display device 5 according to another embodiment. When compared to the display device 1 according to the embodiment of FIG. 1B, differences are mainly described.

In the present embodiment, a maximum width W1L measured from a central axis C to an inner side of the first wiring film 80-1 may be equal to or greater than a maximum width W2L measured from the central axis C to a leftmost side of the component 110, and a maximum width W1R measured from the central axis C to an inner side of the second wiring film 80-2 may be equal to or greater than a maximum width W2R measured from the central axis C to a rightmost side of the component 110.

Figure 11:
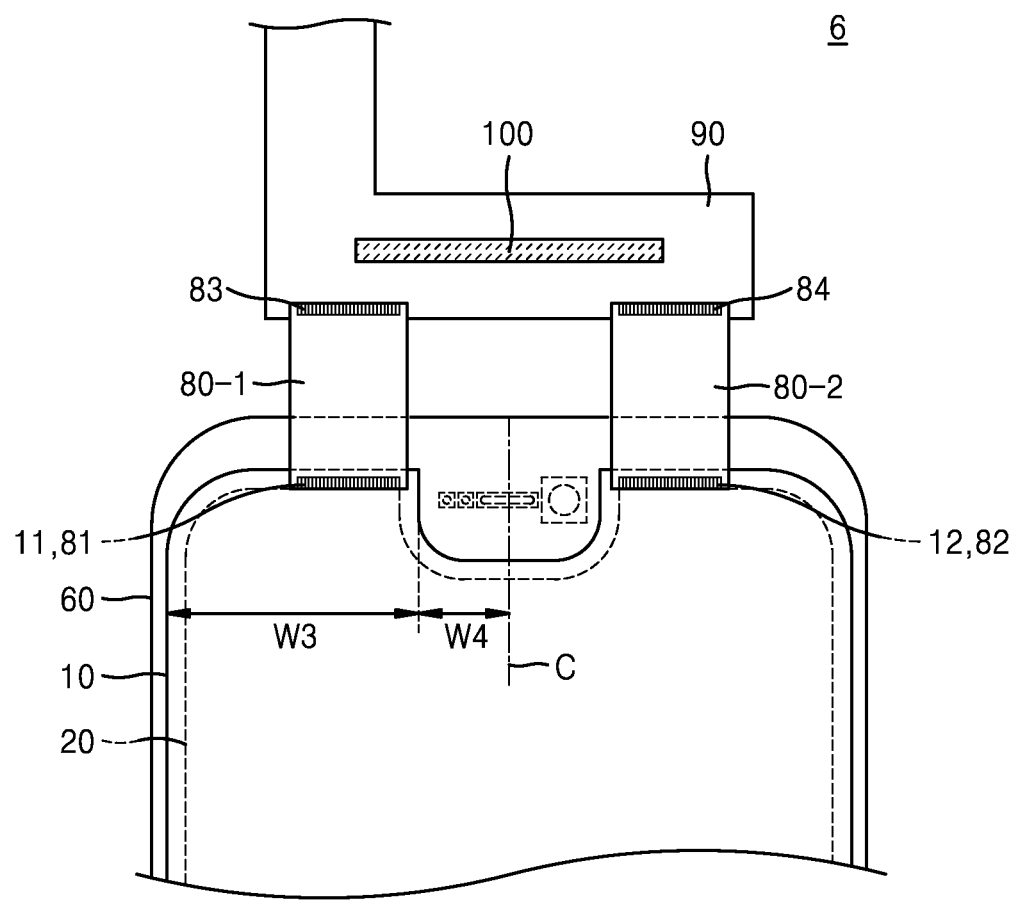
FIG. 11 is a plan view of a portion of a display device according to another embodiment.

FIG. 11 is a plan view of a portion of a display device 6 according to another embodiment. When compared to the display device 1 according to the embodiment of FIG. 1B, differences are mainly described.

In the present embodiment, a maximum width W3 measured from an end on one side of the first indented portion IP1 formed in the substrate 10 to an edge of the substrate 10 may be equal to or greater than a maximum width W4 measured from the end on one side of the first indented portion IP1 to the central axis C. Therefore, an enough space to form the pad groups may be obtained.

Figure 12:
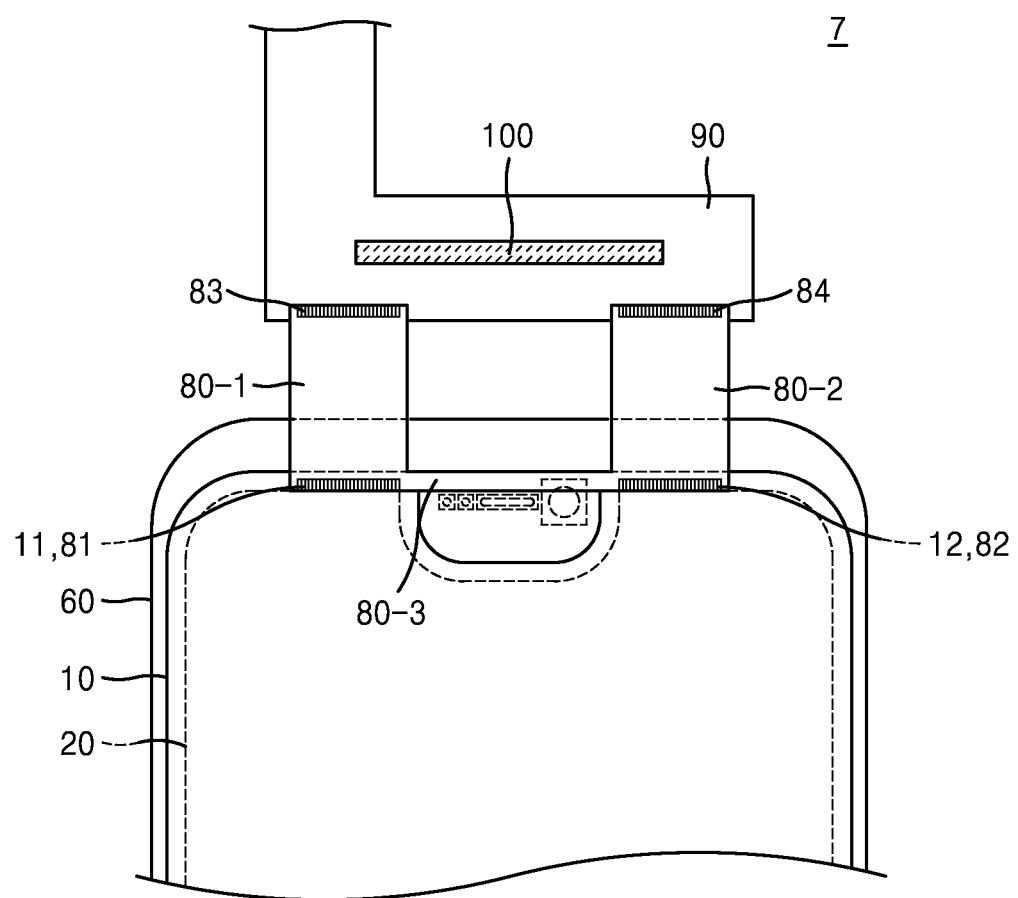
FIG. 12 is a plan view of a portion of a display device according to another embodiment.

FIG. 12 is a plan view of a portion of a display device 7 according to another embodiment. When compared to the display device 1 according to the embodiment of FIG. 1B, differences are mainly described.

In the present embodiment, the wiring film 80 further includes a first connection wiring film 80-3 that is arranged between the third pad group 81 and the fourth pad group 82. The first connection wiring film 80-3 may strengthen adhesive force between the substrate 10 and the first and second wiring films 80-1 and 80-2 by contacting a portion of the substrate 10 between the first pad group 11 and the second pad group 12.

Figure 13:
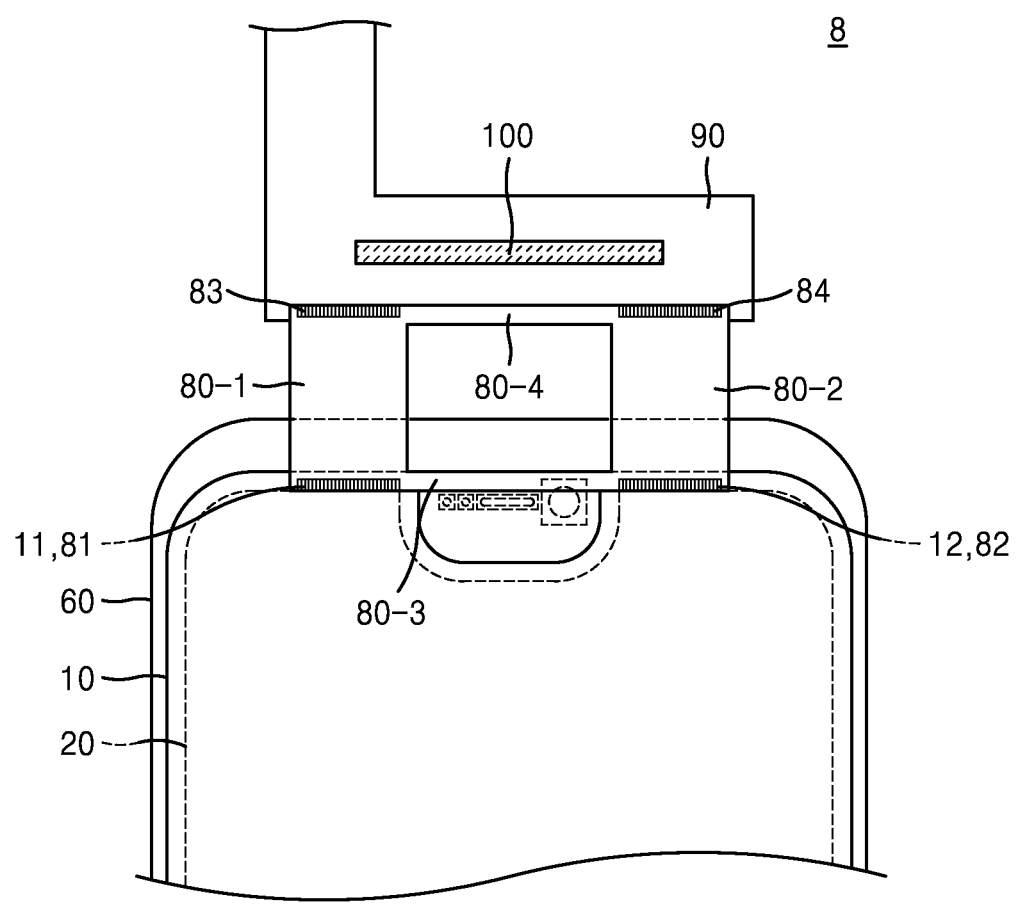
FIG. 13 is a plan view of a portion of a display device according to another embodiment.

FIG. 13 is a plan view of a portion of a display device 8 according to another embodiment. When compared to the display device 7 according to the embodiment of FIG. 12, differences are mainly described.

In the present embodiment, the wiring film 80 further includes a second connection wiring film 80-4 that is arranged between the fifth pad group 83 and the sixth pad group 84 in addition to the first connection wiring film 80-3 that is arranged between the third pad group 81 and the fourth pad group 82. The first and second wiring films 80-1 and 80-2 and the first and second connection wiring films 80-3 and 80-4 form a through hole.

The first and second connection wiring films 80-3 and 80-4 may respectively strength adhesive force between the substrate 10 and the first and second wiring films 80-1 and 80-2 as well as adhesive force between the first and second wiring films 80-1 and 80-2 and the flexible printed circuit board 90.

Figure 14:
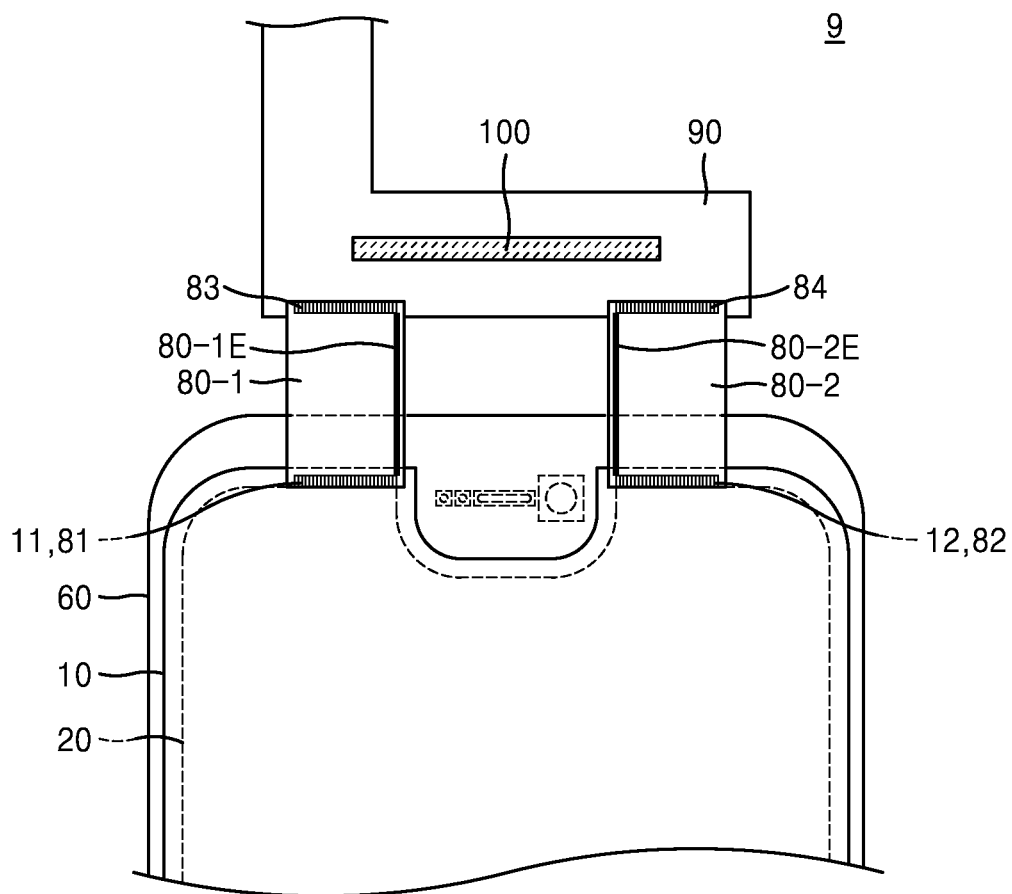
FIG. 14 is a plan view of a portion of a display device according to another embodiment.

FIG. 14 is a plan view of a portion of a display device 9 according to another embodiment. When compared to the display device 1 according to the embodiment of FIG. 1B, differences are mainly described.

In the present embodiment, the first wiring film 80-1 includes a first grounding portion 80-1E, and the second wiring film 80-2 includes a second grounding portion 80-2E. Each of the first grounding portion 80-1E and the second grounding portion 80-2E may include a conductive material. The first grounding portion 80-1E and the second grounding portion 80-2E may be respectively grounded on the first wiring film 80-1 and the second wiring film 80-2 to prevent generation of static electricity of the first wiring film 80-1 and the second wiring film 80-2 and suppress or block an electric noise.

Figure 15:
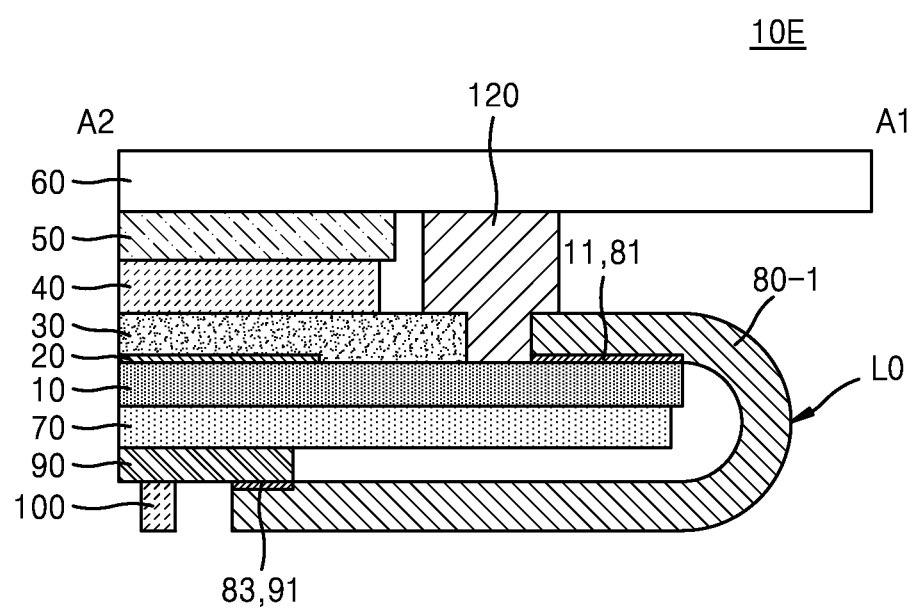
FIG. 15 is a cross-sectional view of a portion of a display device according to another embodiment.

FIG. 15 is a cross-sectional view of a portion of a display device 10E according to another embodiment. When compared to the display device 1 according to the embodiment of FIG. 2, differences are mainly described.

In the present embodiment, a filling material 120 is further arranged between the substrate 10 and the transparent substrate 60. The filling material 120 may disperse an impact applied to the substrate 10 and the transparent substrate 60. Since the filling material 120 surrounds an edge of the encapsulation layer 30 without coming into a direct contact with the display unit 20 and is also spaced apart from the adhesive film 50 by a predetermined interval, a chemical reaction between the filling material 120 and the adhesive film 50 may be prevented, and the filling material 120 may be prevented from penetrating into the display unit 20.

Figure 16A:
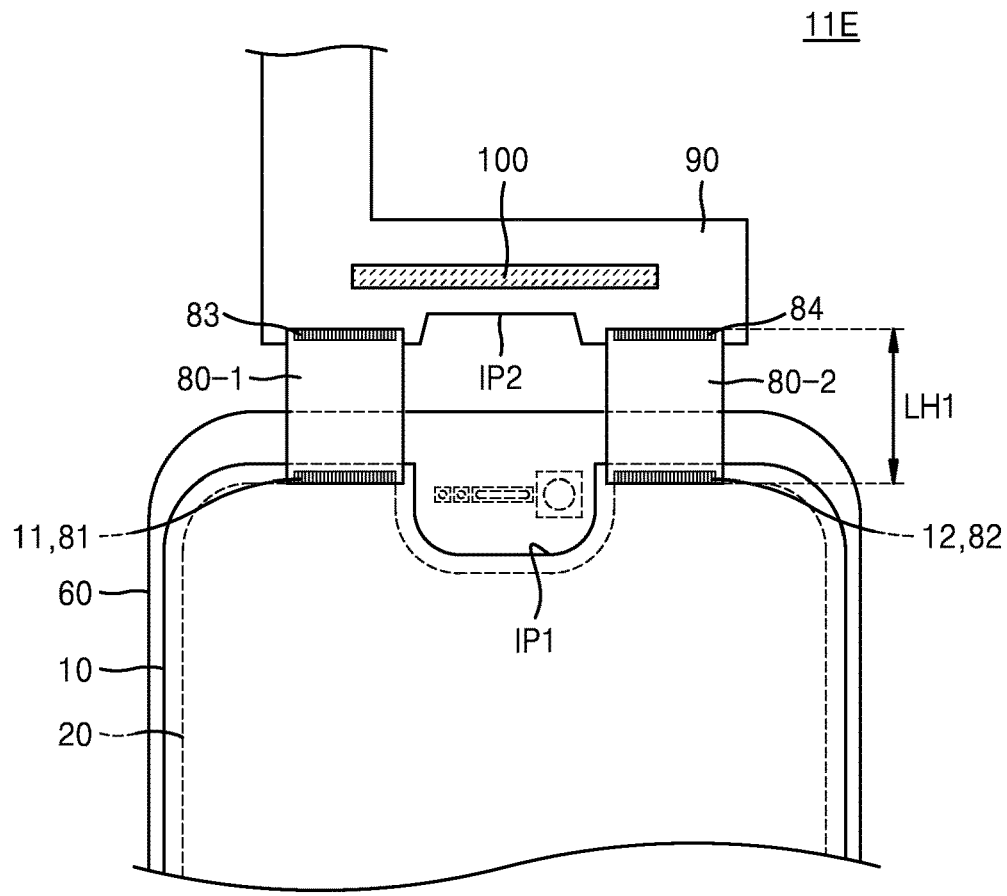
FIGS. 16A and 16B are plan views of a portion of a display device according to another embodiment.
Figure 16B:
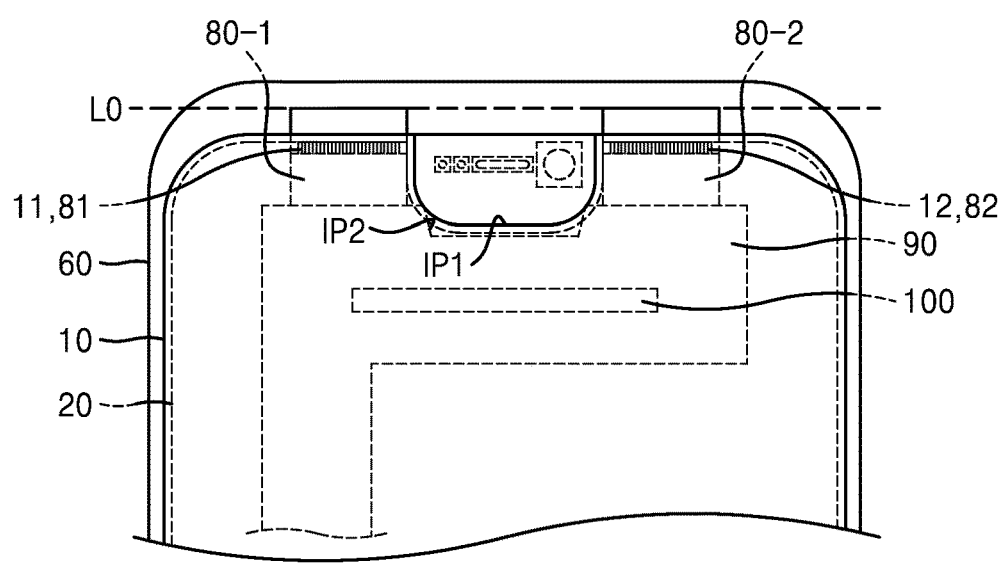

FIGS. 16A and 16B are plan views of a portion of a display device 11E according to another embodiment. When compared to the display device 1 according to the embodiment of FIG. 1B, differences are mainly described.

In the present embodiment, a second indented portion IP2 is formed in one side of the flexible printed circuit board 90 that faces the first indented portion IP1, and is indented toward the inside of the flexible printed circuit board 90 between the first wiring film 80-1 and the second wiring film 80-2. The second indented portion IP2 provides more space between the flexible printed circuit board 90 and the component 110 when lengths of the first wiring film 80-1 and the second wiring film 80-2 of the display device 11E are shortened compared to the display device 1 of FIG. 2.

Figure 17:
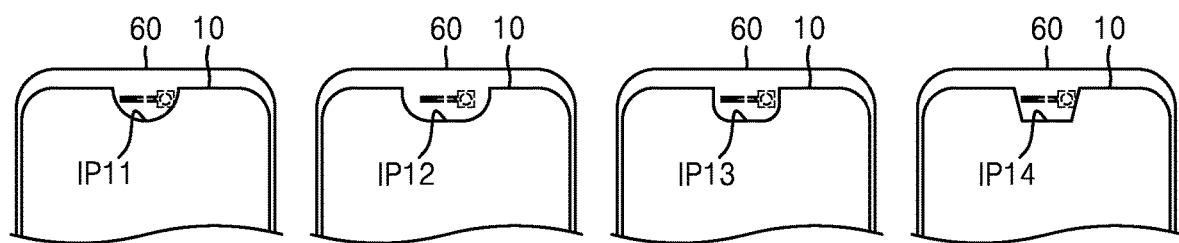
FIG. 17 is a view of various shapes of a first indented portion.

FIG. 17 is a view of various shapes of a first indented portion according to an embodiment. FIG. 17 shows a first indented portion IP11 having a semicircular shape, a first indented portion IP12 having a semi-elliptical shape, a first indented portion IP13 having an arch shape, and a first indented portion IP14 having a quadrangular shape. However, it is noted that the shape of the first indented portion formed in the substrate 10 according to the present disclosure is not limited to the exemplary shapes shown in FIG. 17.

Figure 18:
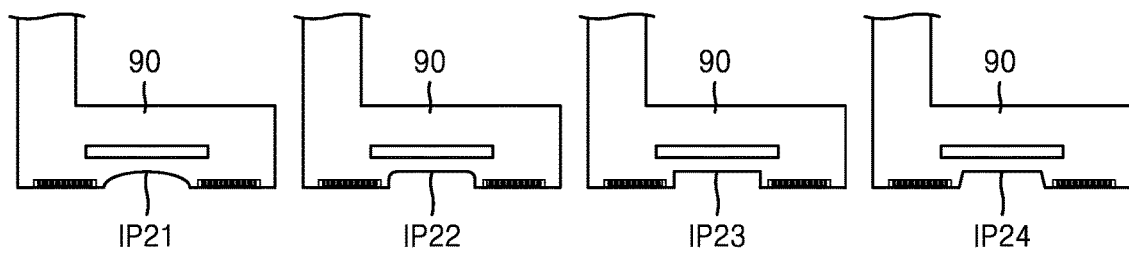
FIG. 18 is a view of various shapes of a second indented portion.

FIG. 18 is a view of various shapes of a second indented portion formed in the flexible printed circuit board 90. FIG. 18 shows a second indented portion IP21 having a semicircular shape, a second indented portion IP22 having a semi-elliptical shape, a second indented portion IP23 having a rectangular shape, and a second indented portion IP24 having a quadrangular shape. However, it is noted that the shape of the second indented portion formed in the flexible printed circuit board 90 according to the present disclosure is not limited to the exemplary shapes shown in FIG. 18.

Embodiments of the present disclosure provide a display device that may facilitate mounting of various components thereon while enlarging a size of a display screen by using a substrate that has an indented shape.

Although the present disclosure has been described with reference to the embodiments illustrated in the drawings, they are merely provided as examples, and it will be understood by those of ordinary skill in the art that various changes in form and details and equivalents thereof may be made therein without departing from the spirit and scope of the present disclosure as defined by the claims.

What is claimed is:
1. A display device comprising:
    a substrate including a first indented portion indented inward along one side of the substrate;
    a first pad group and a second pad group that are spaced apart from each other on the substrate along the one side;
    a display unit located on the substrate and having a shape indented inward between the first pad group and the second pad group;
    an encapsulation layer encapsulating the display unit;
    a first wiring film including a third pad group connected to the first pad group, the first wiring film being bent from a first surface of the substrate to a second surface of the substrate that is opposite to the first surface of the substrate; and
    a second wiring film including a fourth pad group connected to the second pad group, the second wiring film being bent from the first surface of the substrate to the second surface of the substrate and spaced apart from the first wiring film,
    wherein the encapsulation layer includes at least one inorganic layer and at least one organic layer, an outermost layer of the encapsulation layer is an inorganic layer, and the inorganic layer covers a lateral surface of the substrate in which the first indented portion is provided.
2. The display device of claim 1, further comprising:
    a flexible printed circuit board connected to the first wiring film and the second wiring film.
3. The display device of claim 2, wherein the flexible printed circuit board includes an integrated circuit chip that overlaps the display unit.
4. The display device of claim 2, wherein a maximum depth from an edge of a bent region of the first and second wiring film to the flexible printed circuit board is equal to or greater than a maximum depth from the edge of the bent region of the first and second wiring film to the first indented portion.

5. The display device of claim 2, wherein the flexible printed circuit board includes a second indented portion facing the first indented portion and indented inward between the first wiring film and the second wiring film.

6. The display device of claim 2, wherein a distance from one end of the first wiring film to the flexible printed circuit board is equal to or greater than a distance from an end of the first indented portion of the substrate to an end of the substrate.

7. The display device of claim 1, wherein the encapsulation layer includes at least one inorganic layer and at least one organic layer.

8. The display device of claim 1, wherein the encapsulation layer includes at least one inorganic layer and at least one organic layer, an outermost layer of the encapsulation layer is an inorganic layer, and the inorganic layer covers a lateral surface of the at least one organic layer.

9. The display device of claim 1, wherein a dummy pixel for testing is arranged outside the display unit along the first indented portion.

10. The display device of claim 1, wherein a first grounding portion grounded to the first wiring film and a second grounding portion grounded to the second wiring film are respectively arranged on the first wiring film and the second wiring film.

11. The display device of claim 1, wherein a transparent substrate is arranged on the encapsulation layer.

12. The display device of claim 11, wherein a black matrix is arranged on the transparent substrate at a location corresponding to an outside of the display unit.

13. The display device of claim 12, wherein a first opening is provided in the black matrix at a location corresponding to the first indented portion.

14. The display device of claim 13, wherein a second opening is provided in the transparent substrate at a location corresponding to the first opening.

15. The display device of claim 11, further comprising:
a polarization film between the encapsulation layer and the transparent substrate.

16. The display device of claim 15, further comprising:
an adhesive film between the polarization film and the transparent substrate.

17. The display device of claim 16, further comprising:
a filling material spaced apart from the adhesive film and surrounding a periphery of the display unit, the filling material being located between the substrate and the transparent substrate.

18. The display device of claim 1, further comprising:
a cover panel arranged on the second surface of the substrate and including a buffer material.

19. The display device of claim 18, wherein an end of the cover panel coincides with an end of the substrate at the first indented portion.

20. The display device of claim 18, wherein an end of the cover panel protrudes further to an outer side of the display unit than an end of the substrate at the first indented portion.

21. The display device of claim 1, wherein each of the first pad group and the second pad group includes a plurality of pad wirings having oblique lines such that the plurality of pad wirings are symmetric with respect to a center of the first indented portion.

22. A display device comprising:
a substrate including a first indented portion indented inward along one side of the substrate;
a first pad group and a second pad group that are spaced apart from each other on the substrate along the one side;
a display unit located on the substrate and having a shape indented inward between the first pad group and the second pad group;
an encapsulation layer encapsulating the display unit;
a first wiring film including a third pad group connected to the first pad group, the first wiring film being bent from a first surface of the substrate to a second surface of the substrate that is opposite to the first surface of the substrate;
a second wiring film including a fourth pad group connected to the second pad group, the second wiring film being bent from the first surface of the substrate to the second surface of the substrate;
a first connection wiring film connecting the first wiring film to the second wiring film and located between the third pad group and the fourth pad group; and
a second connection wiring film arranged at a location facing the first connection wiring film,
wherein the first and second wiring films and the first and second connection wiring films form a through hole.

* * * * *